United States Patent [19]

Hsu et al.

[11] Patent Number: 5,142,219
[45] Date of Patent: Aug. 25, 1992

[54] SWITCHABLE CURRENT-REFERENCE VOLTAGE GENERATOR

[75] Inventors: Wei-Chan Hsu, Cupertino; Chinh D. Nguyen, San Jose; Fred T. Cheng, Cupertino, all of Calif.

[73] Assignee: Winbond Electronics North America Corporation, Santa Clara, Calif.

[21] Appl. No.: 691,710

[22] Filed: May 1, 1991

[51] Int. Cl.[5] ............................................. G05F 3/16
[52] U.S. Cl. .................................... 323/314; 330/261; 323/317
[58] Field of Search ............... 323/311, 312, 313, 314, 323/315, 316, 317, 273, 280; 330/261

[56] References Cited

U.S. PATENT DOCUMENTS

| 3,903,415 | 9/1975 | Mokrani et al. | 361/58 |
| 4,533,876 | 8/1985 | Haque et al. | 330/253 |
| 4,814,688 | 3/1989 | Colles | 323/317 |
| 4,963,837 | 10/1970 | Dedic | 330/264 |

OTHER PUBLICATIONS

"A CMOS Triple, 100-Mbit/s Video D/A Converter with Shift Register and Color Map", by K. Chi et al., IEEE Journal, Solid-state Circuits, vol. SC-21, No. 6, Dec. 1986, pp. 989-996 by Kuang K. Chi, et al.

Primary Examiner—Steven L. Stephan
Assistant Examiner—Ben Davidson
Attorney, Agent, or Firm—Skjerven, Morrill, MacPherson, Franklin & Friel

[57] ABSTRACT

A reference generator system that operates in either a current-controlled mode or a voltage-controlled mode and includes a power-down circuit connected to the operational amplifier to power down the operational amplifier when the reference generator is switched to the current-controlled mode.

8 Claims, 6 Drawing Sheets

SWITCHABLE CURRENT-REFERENCE VOLTAGE GENERATOR

CROSS-REFERENCE TO RELATED APPLICATIONS

The following copending commonly-assigned patent applications, which are filed on even date herewith, are hereby incorporated herein by reference in their entirety: Chinh D. Nguyen et al., "DAC Current Source With Stabilizing Bias", M-1562; and Wei-Chan Hsu et al., "Dual Sense Amplifier Structure For Video RAM-DACs", M-1563.

BACKGROUND OF THE INVENTION

1. Field of the Invention

This invention relates to reference generators, and more particularly to switchable current-reference voltage generators.

2. Description of Related Art

U.S. Pat. No. 4,814,688 discloses a reference generator which is either responsive to a constant current (current-controlled mode) or a reference voltage (voltage-controlled mode) in maintaining an energizing voltage at a substantially constant value. The system of the '688 patent isolates an operational amplifier 14 from the circuit during the current-controlled mode and prevents the reference voltage $V_{ref}$ provided by source 12 from affecting the operation of the reference generator 10.

A basic schematic of this type of reference generator is shown in FIG. 1. This reference generator includes an operational amplifier 2, switches 4 and 6, a resistor 8, a current source 10, a voltage source $V_{CC}$, and a p-channel transistor 12. The voltage $V_{BIAS}$ is the reference output voltage which is used by the rest of the chip to generate current.

When switches 4A and 4B are at their "on" (i.e. closed) position and switches 6A and 6B are at their "off" (i.e. open) position, as shown, the circuit is in its "voltage-controlled mode". In this configuration, the output $V_{BIAS}$ of operational amplifier 2 is applied to the gate of transistor 12. Therefore, the gate to source voltage $V_{GS}$ of transistor 12 is represented by the equation $$V_{GS} = V_G - V_S \quad (1)$$

where $V_G$ is the gate voltage and $V_S$ is the source voltage. It logically follows from the illustrated circuit that $$V_{GS} = V_{BIAS} - V_{CC} \quad (2)$$

Transistor 12, a p-type MOSFET transistor, conducts when $|V_{GS}|$ exceeds the threshold voltage of transistor 12. Accordingly, current flows along a current path 14 that includes the voltage source $V_{CC}$, the transistor 12, the resistor 8, and ground.

The voltage produced across the resistor 8 is introduced to the positive input of operational amplifier 2 which results in an output voltage appropriate to maintain substantially constant current through the path 14. Current through path 14 is calculated by the following equation:

$$\text{Current} = V_{BIAS}/R_8 \quad (3)$$

in which $R_8$ is the resistance of resistor 8.

When switches 4A and 4B are at their "off" position and switches 6A and 6B are at their "on" position, the circuit is in its "current-controlled mode". Since the output of operational amplifier 2 is disconnected from the gate of transistor 12, operational amplifier 2 has no effect on transistor 12. Instead, the gate of transistor 12 is connected by switch 6A to the drain of transistor 12, so that $$V_{BIAS} = V_{CC} - V_{SD} \quad (4)$$

where $V_{SD}$ is the source-to-drain voltage. The current through path 14 is maintained by the constant current source 10.

In both cases, the voltage $V_{BIAS}$ is determined by the source-drain current of transistor 12.

One major drawback of switching the output of the operational amplifier 2 is that the operational amplifier 2 is "open loop" when switches 4A and 4B are "off". Because the operational amplifier is typically designed with a large voltage gain and bandwidth, this open loop condition causes adverse effects. For example, the open loop condition may cause the output to fluctuate in an exaggerated manner. This fluctuation draws current from the power line or the substrate. Drawing current in this manner causes noise which can propagate to other parts of the circuit, thereby reducing the circuit's performance predictability.

SUMMARY OF THE INVENTION

In accordance with this invention, a reference generator system is provided which overcomes certain of the disadvantages of the prior art by eliminating the "open-loop" operational amplifier previously required in the prior art. The voltage reference circuit of one embodiment of the present invention comprises an operational amplifier having two input terminals. One of the input terminals is connected to a VREF node, and the other input terminal is connected to an IREF terminal. The output of the operational amplifier is connected to a control terminal of a transistor which, along with the IREF terminal, forms part of a current path. The control terminal of the transistor is connected to a VBIAS node. A power-down circuit is connected to the operational amplifier. For the voltage-controlled mode, the IREF node is connected to a resistor for obtaining a voltage and the VREF node is connected to a voltage reference. In addition, the power-down circuit is responsive to a first condition on a control terminal thereof indicative of the voltage-controlled mode for powering-up the operational amplifier. For the current-controlled mode, the IREF node is connected to a current source and to the VBIAS node. In addition, the power-down circuit is responsive to a second condition on the control terminal thereof indicative of the current-controlled mode for powering-down the operational amplifier. In a variation of this embodiment, the power-down circuit control terminal floats for the current-controlled mode, and is connected to $V_{BIAS}$ for the voltage-controlled mode.

This invention will be more fully understood in conjunction with the following detailed description taken together with the following drawings.

DETAILED DESCRIPTION OF THE PREFERRED EMBODIMENT

Figure 2:
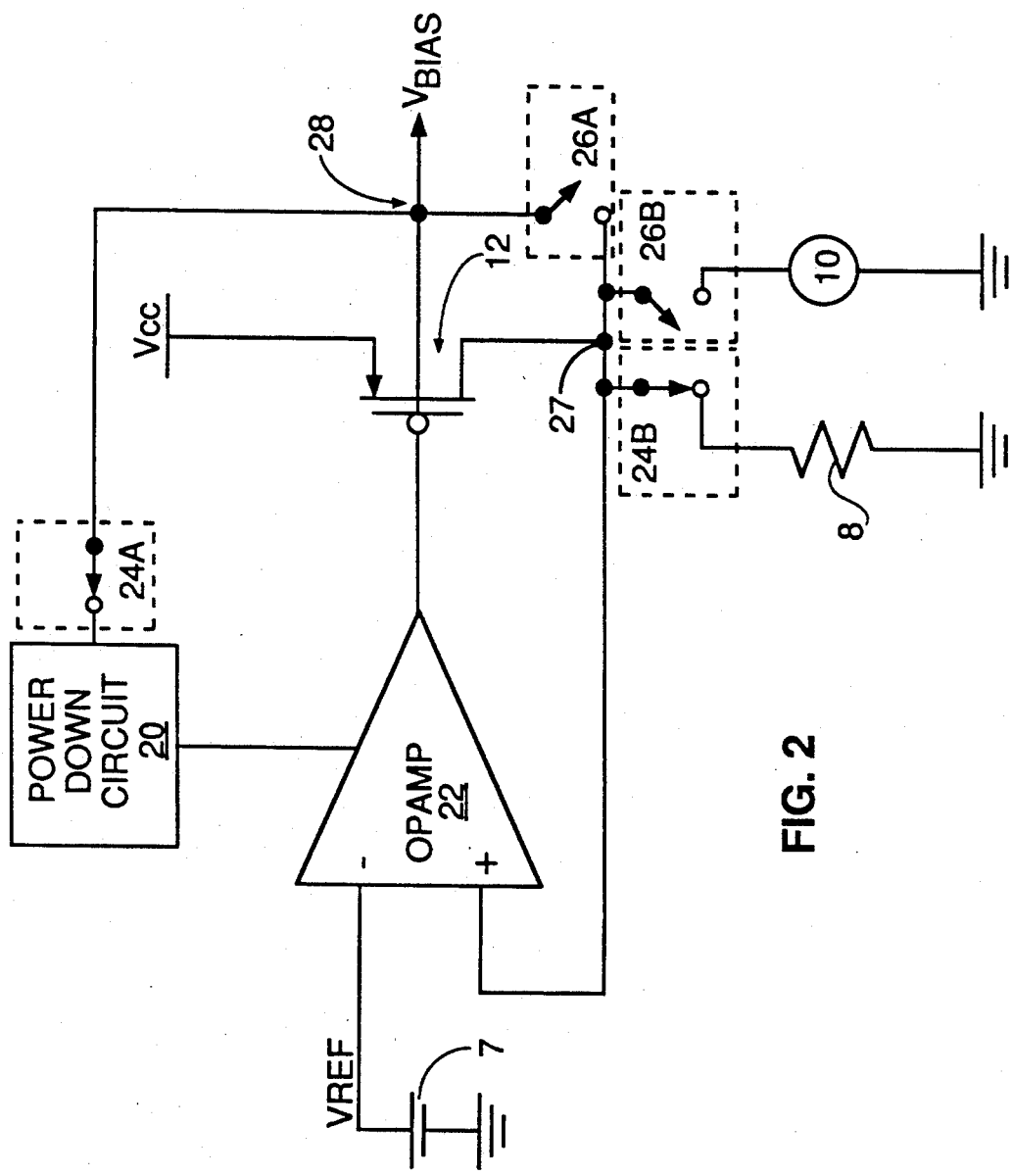
FIG. 2 is a schematic diagram of a selectable "voltage-controlled mode" or "current-controlled mode" circuit, in accordance with the present invention.

As shown in FIG. 2, the reference voltage $V_{REF}$ is connected to the negative terminal of the operational amplifier 22. Node 27 is connected to the positive input of operational amplifier 22. The output of operational amplifier 22 is connected to the gate of transistor 12. Node 27 is a common terminal for switches 24B and 26B. The other terminal of switch 24B is connected to resistor 8, which in turn is connected to ground. The other terminal of switch 26B is connected to current source 10, which in turn is connected to ground. The drain of transistor 12 is connected to node 27. Voltage $V_{CC}$ is connected to the source of transistor 12.

The voltage introduced to the gate of the transistor 12 is also introduced to node 28. Nodes 27 and 28 are controllably connected or disconnected by the use of switch 26A. Node 28 is controllably connected or disconnected to a power-down circuit 20 with switch 24A. Power-down circuit 20 is connected to the operational amplifier 22, which is modified to receive the output of the power down circuit 20.

Figure 1:
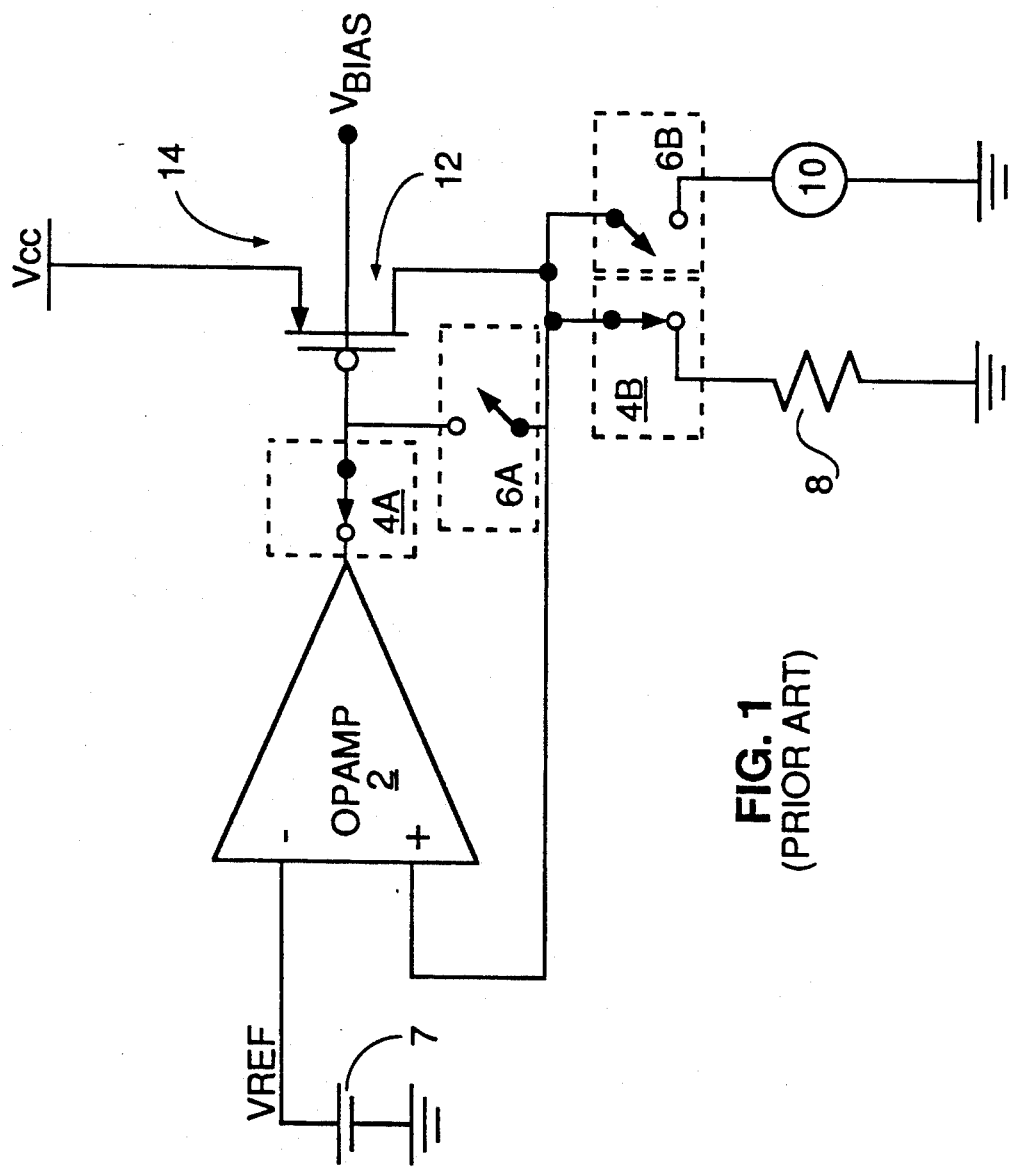
FIG. 1 is a schematic diagram of a selectable "voltage-controlled mode" or "current-controlled mode" circuit, in accordance with the prior art.

The basic circuit structure shown in FIG. 2 differs from the circuit shown in FIG. 1 in at least two aspects. First, there is no switch between the gate of transistor 12 and the operational amplifier 22. Second, when switches 26 (i.e. 26A and 26B) are "on" and switches 24 (i.e. 24A and 24B) are "off", node 28 is disconnected from the power-down circuit 20, which then generates a power-down signal to the operational amplifier 22.

Figure 3:
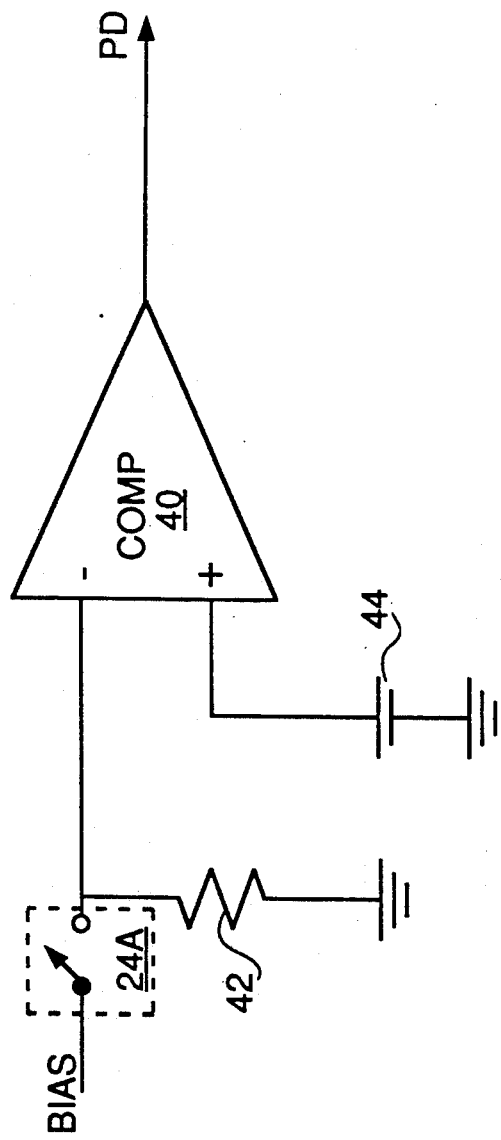
FIG. 3 is a schematic diagram of an illustrative power-down circuit.

FIG. 3 shows an illustrative power-down circuit 20. The power-down circuit 20 includes a comparator 40, a pulldown resistor 42, and a reference voltage 44. The negative input of comparator 40 is connected to resistor 42 which is grounded, and to switch 24A. The reference voltage 44 provides input to the positive input terminal of comparator 40.

When switch 24A is "off", no voltage is present at the negative input of the operational amplifier 40, and the voltage on the positive input from source 44 causes the output of the comparator 40 to rise to the supply voltage. When the switch 24A is "on", $V_{BIAS}$ is imposed on the negative input of the comparator 40. Because reference voltage 44 is between ground and $V_{BIAS}$, the output of comparator 40 is low. This output is the power-down signal "PD" which is sent to the modified operational amplifier 22 to power it up or down, as appropriate, in a controllable manner for reducing the level of noise introduced into the circuit.

An illustrative component-level embodiment of the controllable voltage-controlled mode / current-controlled mode reference generator is shown in FIG. 4. The operation of this circuit is as follows.

Figure 4A:
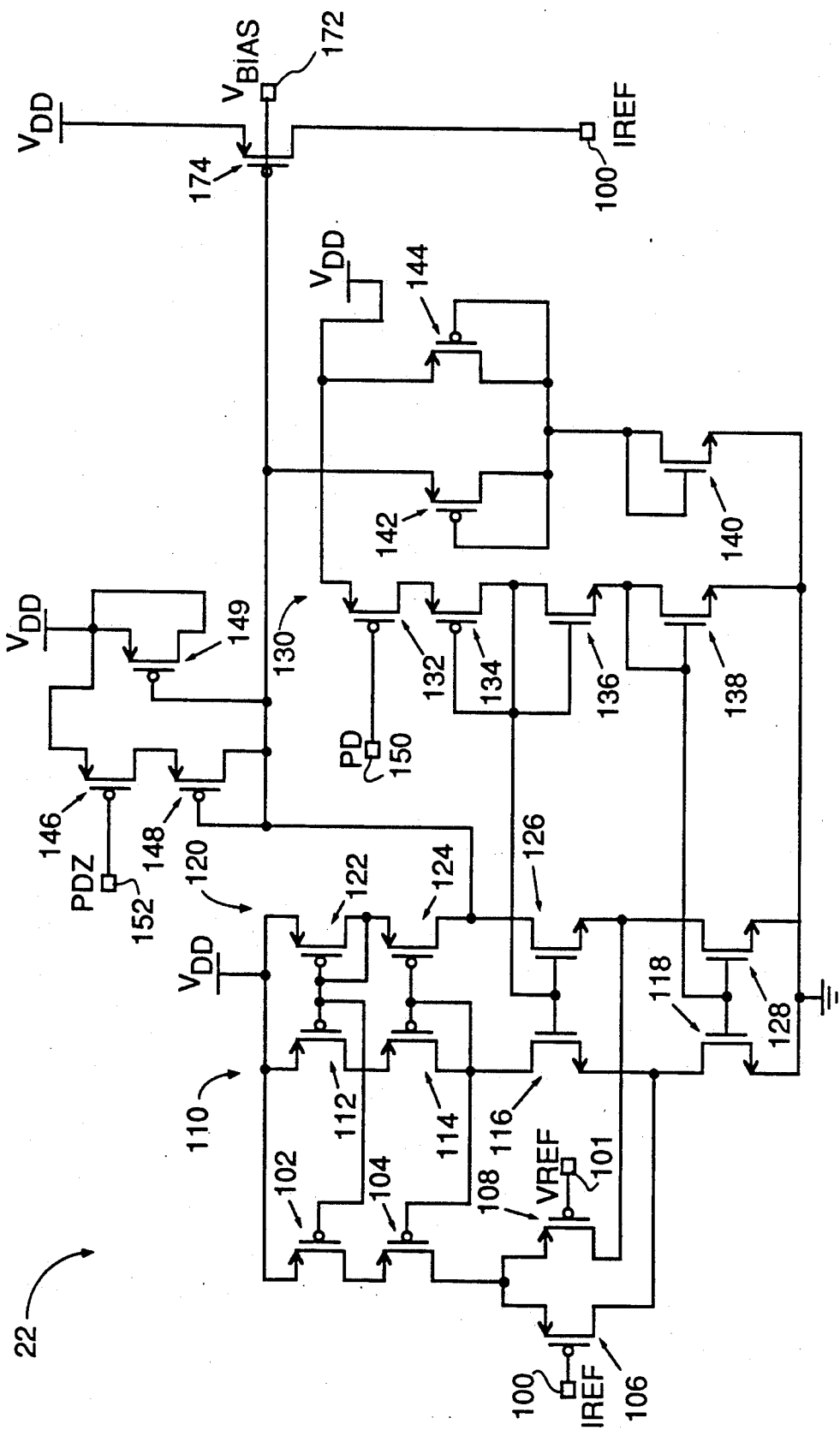
FIG. 4 is a component-level schematic diagram of a controllable voltage-controlled mode/current-controlled mode reference generator.

The operation amplifier 22 shown in FIG. 4A is generally a conventional operational amplifier that is modified to respond to control signals at power-down ("PD") node 150 and power-down complement ("PDZ") node 152. Other operational amplifier designs may be suitable as well. P-channel MOSFETs 106 and 108 are connected as a differential pair receiving at their commonly connected sources a constant current from the current path comprising $V_{DD}$ and cascode p-channel MOSFET transistors 102 and 104. The gate of transistor 106 is connected to the IREF node 100 which is made accessible, for example, through a pin of the packaged integrated circuit. The gate of transistor 108 is connected to a VREF node 101, which is made accessible, for example, through a pin of the packaged integrated circuit. In the current-controlled mode, IREF node 100 is connected to a constant current source, such as source 10 in FIG. 2, and VREF node 101 is left floating or connected to a constant voltage reference such as source 7 in FIG. 2. In the voltage-controlled mode, VREF node 101 is connected to a constant voltage reference such as source 7 in FIG. 2, and IREF node 100 is connected to one terminal of a suitable resistor such as resistor 8 of FIG. 2, the other terminal of which is connected to ground.

The drains of the transistors 106 and 108 are connected to respective output branch circuits 110 and 120. Branch 110 comprises $V_{DD}$, cascode p-channel MOSFETs 112 and 114, cascode n-channel MOSFETs 116 and 118, and ground. Branch 120 comprises $V_{DD}$, cascode p-channel MOSFETs 122 and 124, cascode n-channel MOSFETs 126 and 128, and ground. The gates of transistors 102, 112, and 122 are commonly connected, and connected to the drain of transistor 122 and source of the transistor 124 in the output branch 120. The gates of transistors 104, 114 and 124 are commonly connected, and connected to the drain of transistor 114 and the drain of the transistor 116 in the output branch 110. The node common to the drain of transistor 124 and the drain of transistor 126 in the output branch 120 is VBIAS node 172. In branch 110, the source of transistor 116 and the drain of transistor 118 are connected in common with the drain of transistor 106. In branch 120, the source of transistor 126 and the drain of transistor 128 are connected in common with the drain of transistor 108.

Whether the operational amplifier 22 is in a power-up or power-down condition depends on the bias on the commonly connected gates of transistor 116 and 126, and on the commonly connected gates of transistor 118 and 128. These biases are determined by circuit branch 130, which comprises $V_{DD}$, cascode p-channel MOSFETs 132 and 134, cascode n-channel MOSFETs 136 and 138, and ground. The gate of transistor 132 is connected to PD terminal 150. The gates of transistors 134 and 136 are commonly connected with the drains of transistors 134 and 136, and with the gates of transistors 116 and 126 in output circuits 110 and 120. The gate of transistor 138 is connected to the commonly connected source of transistor 136 and drain of transistor 138, and to the gates of transistors 118 and 128 in output circuits 110 and 120.

Another circuit is provided to help pull up $V_{BIAS}$ node 172 during the current-controlled mode. During the current-controlled mode, signal PDZ at node 152 is low. P-channel MOSFET 146, which has its source connected to $V_{DD}$ and its drain connected to p-channel MOSFET 148, turns "on". Transistor 148, which has its gate and drain connected to VBIAS, also turns "on", thereby supplying current to node $V_{BIAS}$. The current path is completed through p-channel MOSFET 142, which has its source connected to $V_{BIAS}$ node 172, and through n-channel MOSFET 140, which has its gate and drain connected in common with the gate and drain of transistor 142, and its source connected to ground. Once $V_{BIAS}$ node 172 is sufficiently pulled up, current through transistor 142 diminishes and is steered through transistor 144, which has its source connected to $V_{DD}$ and its gate and drain connected in common with the gates and drains of, respectively, transistor 142 and 140. During the voltage-controlled mode, transistor 146 and 148 are "off", since signal PDZ at node 152 is high, and current is steered through transistor 144 rather than transistor 142.

P-channel MOSFET 149, which has its gate connected to VBIAS node 172 and its source and drain connected to $V_{DD}$, acts generally like a capacitor to reduce noise on $V_{BIAS}$ node 172.

IREF node 100 also is shorted to $V_{BIAS}$ node 172, which is made accessible, for example, through a pin of the packaged integrated circuit.

Figure 4B:
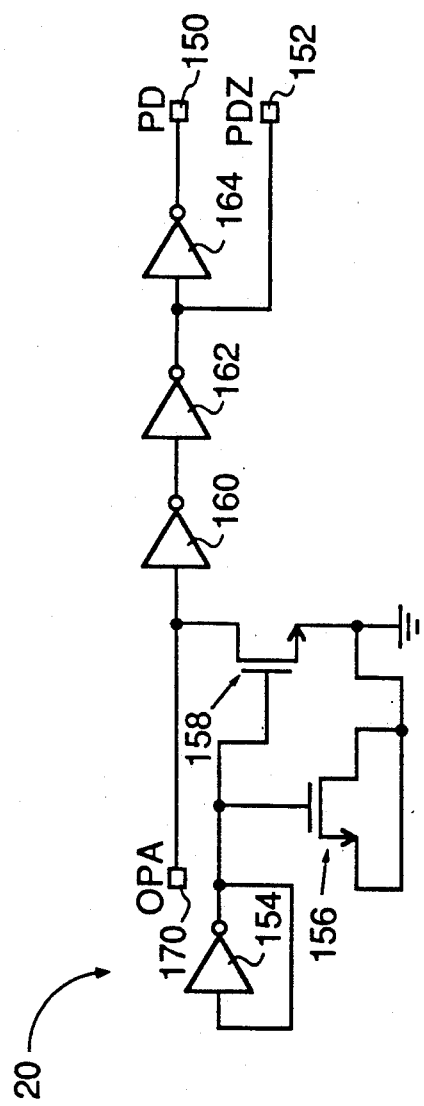
Figure 5:
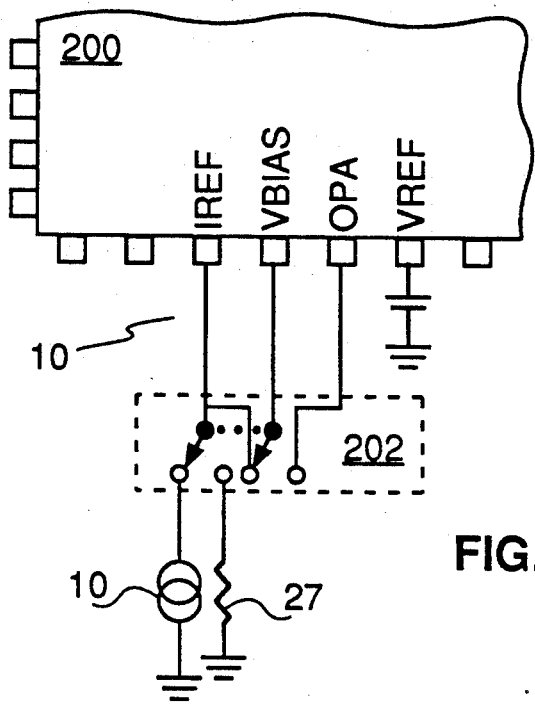
FIGS. 5 and 6 are schematic diagrams showing an illustrative integrated circuit and switch in the current-controlled mode and voltage-controlled mode, respectively.

The power-down circuit 20 shown in FIG. 4B operates in conjunction with the operational amplifier 22 as follows. In the current-controlled mode, IREF terminal 100 is connected to a current source, such as source 10 of FIG. 2, and also shorted to $V_{BIAS}$ node 172, and OPA node 170 in the power-down circuit 20, which is accessible, for example, through a pin of the packaged integrated circuit, is left floating. These connections are shown in FIG. 5 for an illustrative integrated circuit 200 and switch 202, which may be implemented mechanically or electrically. The voltage at the gate of n-channel MOSFET 158 is established to turn on transistor 158. In the embodiment of FIG. 4B, two volts is sufficient to turn on transistor 158. When transistor 158 is "on", i.e. conducting, OPA node 170 is pulled toward ground. The voltage at the output of inverter 154 is established by the ratio of the p-type and n-type transistors comprising inverter 154. One example of a ratio used in the present invention is where the p-type transistor has a width of 2.5µ and a length of 20µ and the n-type transistor has a width of 20µ and a length of 2.5µ. Transistor 156 acts as a loading element to eliminate noise which would otherwise be created by this fast circuit.

When OPA node 170 is pulled to ground, a logical zero signal is asserted at the input of inverter 160. Inverter 160 inverts this signal into a logical one, which is in turn inverted by inverter 162 to produce a logical zero. Hence, the signal delivered to PDZ node 152 is zero. As seen in FIG. 4, inverter 164 inverts the logical zero signal and outputs a signal of logical one to PD node 150.

A logical one signal to PD node 150 turns off transistor 132 of the operational amplifier circuit branch 130. Therefore, no current flows through current 130. It follows that the gates of transistors 134, 136, 138, 116, 126, 118 and 128 are floating. If there is no bias, then the operational amplifier 22 enters into a power-down state in which the transistors 102, 104, 106, 108, 112, 114, 116, 118, 122, 124, 126 and 128 turn off.

Because node 152 is a logical zero signal in the current-controlled mode, transistors 146 and 148 are "on". Transistor 149 functions to stabilize the circuit, and serves as a customized element of the circuit. $V_{BIAS}$ node 172 has a Voltage of $V_{DD} - 2V_{TD}$ where $V_{DD}$ is the source voltage and $V_{TD}$ is the threshold voltage drop of transistors 146 and 148. Typically, $V_{DD}$ is five volts and the voltage $V_{TD}$ is about one volt. The voltage at $V_{BIAS}$ node 172 is applied to the gate of p-channel MOSFET 174, which has its source connected to $V_{DD}$ and its drain connected to IREF node 100. The value of $V_{BIAS}$ is suitably selected to operate transistor 174 in its linear region.

Figure 6:
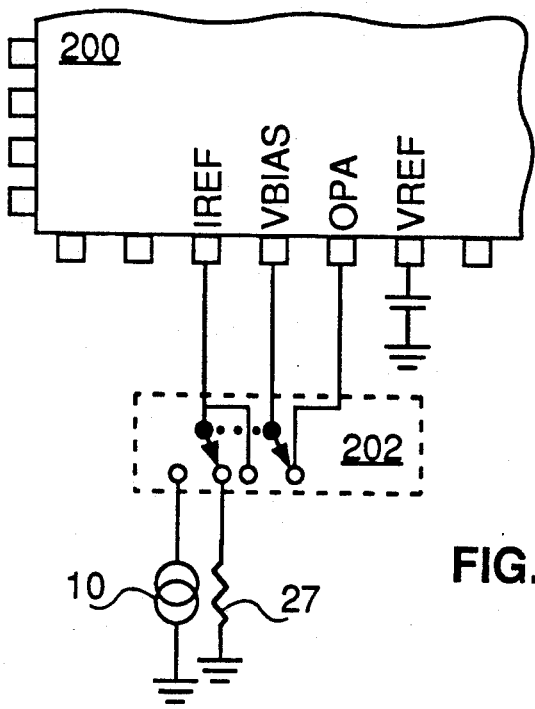

In the voltage-controlled mode, IREF terminal 100 is connected to a suitable resistor 8 (FIG. 2) of, for example, 147 ohms; the VREF terminal 102, which is accessible, for example, through a pin of the packaged integrated circuit, is connected to a suitable voltage reference source 7 (FIG. 2) of, for example, 1.235 volts; and OPA node 170 of power-down circuit 20 is shorted to $V_{BIAS}$ node 172. These connections are shown in FIG. 6 for an illustrative integrated circuit package 200 and switch 202. Hence, the voltage at $V_{BIAS}$ node 172 is introduced to OPA node 170, although a separate voltage reference may be used if desired. Typically, the voltage applied to OPA node 170 is three volts. Transistor 158 is ineffective in pulling down $V_{BIAS}$. Three volts is considered a "high" voltage. Therefore, in the voltage-controlled mode, a logical one signal is inverted by inverter 160. The resulting logical zero signal is subsequently inverted to a logical one signal by inverter 162 and becomes the voltage applied to node PDZ. Inverter 164 inverts the logical one signal to zero which is applied to PD node 150.

A logical one at PDZ node 152 causes transistors 146 and 148 to turn off. The logical zero signal at PD node 150 will turn on all the other transistors in the operational amplifier 22 required to establish suitable bias potentials of the commonly connected gates of transistors 116 and 126, and at the commonly connected gates of transistors 118 and 128. Hence, the voltage-controlled mode is established with IREF equal to 8.4 milliamps (1.235/147 amps).

The width and length of the transistors in FIGS. 4A and 4B are as set forth in Table 1, in which the first number is channel width in microns and the second number is channel length in microns.

TABLE 1

| (Transistor # (Width:Length)) | | | |
|---|---|---|---|
| 102 (320:4) | 104 (400:2) | 106 (120:4) | 108 (120:4) |
| 112 (160:4) | 114 (200:2) | 116 (60:4) | 118 (120:6) |
| 122 (160:4) | 124 (200:2) | 126 (60:4) | 128 (120:6) |
| 132 (50:2) | 134 (10:10) | 136 (30:6) | 138 (30:6) |
| 140 (3:6) | 142 (20:4) | 144 (20:4) | 146 (11:2) |
| 148 (5.5:4) | 149 (360:4) | 154P (2.5:20) | 154N (20:2.5) |
| 156 (10:10) | 158 (5.5:50) | 160P (11:44) | 160N (11:44) |
| 174 (2500:4) | | | |

While our invention has been described with respect to certain embodiments, the scope of the present invention is defined by the appended claims and is not necessarily limited to the embodiments described herein, which are merely illustrative. For example, the fabrication technology, the specific voltage levels, and the specific arrangement of conventional circuits are illustrative. Accordingly, other embodiments and variations not described herein may be within the scope of our invention, as defined by the appended claims.

What is claimed is:

1. A reference generator comprising:
an operational amplifier having first and second input terminals;
a VREF node connected to the first input terminal of said operational amplifier;

a current path comprising a transistor and an IREF node, said transistor having a control terminal connected to an output of said operational amplifier, and said IREF node being connected to the second input terminal of said operational amplifier;

a VBIAS node connected to the control terminal of said transistor; and a power-down circuit connected to said operational amplifier;

wherein for a voltage-controlled mode, said IREF node is connected to a resistor for obtaining a voltage, said VREF node is connected to a voltage reference, and said power-down circuit is responsive to a first condition on a control terminal thereof indicative of said voltage-controlled mode for powering-up said operational amplifier;

and wherein for a current-controlled mode, said IREF node is connected to a current source and to said VBIAS node, and said power-down circuit is responsive to a second condition on the control terminal thereof indicative of said current-controlled mode for powering-down said operational amplifier.

2. A reference generator as in claim 1, wherein:
the control terminal of said power-down circuit control terminal is node OPA;
the first condition of said OPA node is a connection to said VBIAS node; and
the second condition of said OPA node is a floating condition.

3. A reference generator as in claim 1, wherein said operational amplifier comprises a biasing circuit connected to biasing points in said operational amplifier, said biasing circuit being responsive to said power-down circuit for furnishing bias potentials to said biasing points during said voltage-controlled mode, and for floating said biasing points during said current-controlled mode.

4. An operational amplifier comprising:
a first transistor, a source of said first transistor connected to a voltage source;
a second transistor, a source of said second transistor connected to a drain of said first transistor;
a third transistor, a gate of said third transistor connected to a reference current source in a current-controlled mode or a resistor in a voltage controlled mode, a source of said third transistor connected to a drain of said second transistor;
a fourth transistor, a gate of said fourth transistor connected to a reference voltage source, a source of said fourth transistor connected to said drain of said second transistor;
a fifth transistor, a source of said fifth transistor connected to said voltage source;
a sixth transistor, a source of said sixth transistor connected to said voltage source;
a seventh transistor, a source of said seventh transistor connected to a drain of said fifth transistor;
an eighth transistor, a source of said eighth transistor connected to a drain of said sixth transistor;
a ninth transistor, a drain of said ninth transistor connected to a drain of said seventh transistor;
a tenth transistor, a drain of said tenth transistor connected to a drain of said eighth transistor;
an eleventh transistor, a drain of said eleventh transistor connected to a source of said ninth transistor, a source of said eleventh transistor being connected to ground;

a twelfth transistor, a drain of said twelfth transistor connected to a source of said tenth transistor, a source of twelfth transistor being connected to said ground;

a thirteenth transistor, a source of said thirteenth transistor connected to said voltage source;

a fourteenth transistor, a source of said fourteenth transistor connected to a drain of said thirteenth transistor;

a fifteenth transistor, a drain of said fifteenth transistor connected to a drain of said fourteenth transistor;

a sixteenth transistor, a drain of said sixteenth transistor connected to a source of said fifteenth transistor, a source of said sixteenth transistor connected to said ground;

wherein gates of said first, fifth, and sixth transistors are connected to said source of said eighth transistor, gates of said second, seventh, and eighth transistors are connected to said drain of said ninth transistor, drains of said third and fourth transistors are connected to said drain of said eleventh transistor and said drain of said twelfth transistor, respectively;

wherein gates to said ninth, tenth, fourteenth, and fifteenth transistors are connected to a drain of said fifteenth transistor, and gates of said eleventh, twelfth, and sixteenth transistors are connected to said source of said fifteenth transistor;

further wherein a logical one signal applied to a gate of said thirteenth transistor powers down said operational amplifier.

5. An operational amplifier of claim 4 further comprising a seventeenth transistor, a source of said seventeenth transistor connected to said voltage source;

an eighteenth transistor, a source of said eighteenth transistor connected to a drain of said seventeenth transistor, a drain and gate of said eighteenth transistor connected to said drain of said eighth transistor;

wherein a logical one signal to a gate of said seventeenth transistor powers up said operational amplifier.

6. An operational amplifier of claim 5 further comprising a power down circuit having a nineteenth transistor, a source of said nineteenth circuit connected to said ground, a drain of said nineteenth transistor connected to said gate of said eighteenth transistor when said operational amplifier is in a voltage-controlled mode or left floating when in a current-controlled mode;

a first inverter, an input and an output of said first inverter connected to a gate of said nineteenth transistor;

a second inverter, an input of said second inverter connected to said drain of said nineteenth transistor;

a third inverter, an input of said third inverter being an output of said second inverter;

a fourth inverter, the input of said fourth inverter being an output of said third inverter;

wherein an output of said fourth inverter is applied to said gate of said thirteenth transistor; and wherein said output of said third inverter is applied to said gate of said seventeenth transistor.

7. A reference generator, controllably operable in a voltage mode or a current mode, comprising:
means for providing a reference current path;

two voltage input means, one of said voltage input means being coupled to said reference current path providing means;

means for amplifying a voltage difference between said input means with high gain and bandwidth, said amplifying means having an output coupled to said reference current path providing means; and means for powering down said amplifying means, said powering down means being responsive to a transition from voltage mode operation to current mode operation for selectively disabling current flow in said amplifying means and responsive to a transition from current mode operation to voltage mode operation for selectively enabling current flow in said amplifying means.

8. The generator of claim 7 wherein said reference current path providing means comprises means for indicating a bias voltage coupled to the output of said amplifying means; and wherein, in the current mode, said bias voltage indicating means is connected to a current source; and further wherein in the voltage mode, said voltage bias indicating means is connected to a resistance.

* * * * *

UNITED STATES PATENT AND TRADEMARK OFFICE
CERTIFICATE OF CORRECTION

PATENT NO. : 5,142,219
DATED : August 25, 1992
INVENTOR(S) : Wei-Chan Hsu, et. al.

It is certified that error appears in the above-indentified patent and that said Letters Patent is hereby corrected as shown below:

On the Title page, item [75], the third inventor name should read as follows:
--Fred Tun-Jen Cheng--.

Column 5, line 56, after "current" (second occurrence) insert --branch--.

Signed and Sealed this

First Day of February, 1994

Attest:

BRUCE LEHMAN

Attesting Officer

Commissioner of Patents and Trademarks